(12) United States Patent
Swier et al.

(10) Patent No.: US 6,905,342 B2
(45) Date of Patent: Jun. 14, 2005

(54) PROTECTED ELECTRICAL INTERCONNECT ASSEMBLIES

(75) Inventors: Wayne K. Swier, Albany, OR (US); Leo C. Clarke, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/404,356

(22) Filed: Apr. 1, 2003

(65) Prior Publication Data

US 2004/0198074 A1 Oct. 7, 2004

(51) Int. Cl.$^7$ .............................................. H01R 12/00
(52) U.S. Cl. ............................ 439/65; 439/876; 347/50
(58) Field of Search ............................ 439/65, 876, 50, 439/196–204; 347/58, 50

(56) References Cited

U.S. PATENT DOCUMENTS

| | | | | |
|---|---|---|---|---|
| 4,654,752 A | * | 3/1987 | Kyle ............................ 361/718 |
| 5,147,084 A | | 9/1992 | Behun et al. ............... 228/56.3 |
| 5,258,781 A | | 11/1993 | John ........................ 346/140 R |
| 5,442,386 A | * | 8/1995 | Childers et al. ............... 347/50 |
| 5,450,101 A | | 9/1995 | Ishida et al. ................. 347/200 |
| 5,681,757 A | | 10/1997 | Hayes ............................. 437/7 |
| 6,071,427 A | | 6/2000 | Raulinaitis .................... 216/27 |
| 6,133,072 A | | 10/2000 | Fjelstad ........................ 438/128 |
| 6,142,609 A | | 11/2000 | Aoki ............................. 347/50 |
| 6,188,414 B1 | | 2/2001 | Wong et al. ................... 347/42 |
| 6,206,507 B1 | | 3/2001 | Hino ............................. 347/50 |
| 6,241,340 B1 | | 6/2001 | Watanabe et al. ............. 347/50 |
| 6,283,359 B1 | | 9/2001 | Brofman et al. ....... 228/180.22 |
| 6,325,491 B1 | * | 12/2001 | Feinn ........................... 347/50 |
| 6,328,427 B1 | | 12/2001 | Watanabe et al. ............. 347/58 |
| 6,329,609 B1 | | 12/2001 | Kaja et al. ................... 174/262 |
| 6,357,864 B1 | | 3/2002 | Sullivan et al. ............... 347/58 |
| 6,364,475 B2 | | 4/2002 | Feinn et al. ................... 347/87 |
| 6,378,984 B1 | | 4/2002 | Steinfield et al. ............. 347/47 |
| 6,402,299 B1 | | 6/2002 | DeMeerleer et al. .......... 347/50 |
| 6,425,655 B1 | | 7/2002 | Patil ............................. 347/50 |
| 6,426,566 B1 | * | 7/2002 | Sawamoto ................... 257/783 |
| 6,433,419 B2 | | 8/2002 | Khandros et al. ............ 257/698 |
| 6,531,806 B1 | * | 3/2003 | Daidai ......................... 310/344 |
| 6,641,254 B1 | * | 11/2003 | Boucher et al. ............... 347/50 |
| 2001/0013423 A1 | | 8/2001 | Dalal et al. .................. 174/260 |
| 2001/0025874 A1 | * | 10/2001 | Nishiyama ............. 228/180.22 |
| 2002/0003556 A1 | | 1/2002 | Mori ............................. 347/50 |
| 2002/0093550 A1 | | 7/2002 | Watanabe ..................... 347/58 |
| 2002/0113324 A1 | | 8/2002 | Cordes et al. ............... 257/784 |
| 2002/0117330 A1 | | 8/2002 | Eldridge et al. ............ 174/260 |
| 2004/0177997 A1 | * | 9/2004 | Hata et al. ................... 174/257 |

* cited by examiner

Primary Examiner—Michael C. Zarroli (57) ABSTRACT

The described embodiments relate to electrical interconnect assemblies and methods of forming same. One exemplary method applies a generally flowable protective material to an electrical interconnect region comprising portions of at least two conductors. The method also exposes the protective material to conditions sufficient to render the protective material to a generally non-flowable state which protects the electrical interconnect region from degradation, wherein said exposing also reflows solder positioned proximate the electrical interconnect region to allow the solder to bond with the at least two conductors.

26 Claims, 6 Drawing Sheets

PROTECTED ELECTRICAL INTERCONNECT ASSEMBLIES

BACKGROUND OF THE INVENTION

Electronic devices which operate in potentially damaging environments pose challenging design problems. The damaging environment may be due to external factors such as ambient moisture, and/or to conditions caused by the electronic device itself. One such example, where the electronic device creates the damaging environment, entails ink jet printing devices. Ink jet printing devices eject fluidic ink from multiple nozzles arranged on one or more print cartridges onto a print media to form a desired image. During the ink ejection process, some of the ink that is ejected does not actually contribute to the desired image, but instead becomes what is generally referred to as "non-target ink".

This non-target ink can assume various forms. Generally, the non-target ink becomes an aerosol, a powder, or liquid colloid among other forms, and as such can drift and land on components of the printing device especially the print cartridge(s). The non-target ink can degrade certain components, most notably various electrical conductors that are commonly comprised of metal. The conductors can be especially difficult to protect from degradation where two or more conductors form a connection or "electrical interconnect."

Accordingly, the present invention provides an advantageous method of protecting electrical interconnects from degradations and resultant protected structures.

BRIEF DESCRIPTION OF THE DRAWINGS

The same components are used throughout the drawings to reference like features and components.

DETAILED DESCRIPTION OF THE PREFERRED EMBODIMENT OVERVIEW

The embodiments described below pertain to electrical interconnect assemblies and methods of forming same. An electrical interconnect comprises at least one conductor electrically coupled or interconnected to another conductor. One suitable electrical interconnect comprises a first conductor that is electrically coupled to a second conductor with solder or other material. The electrical interconnect has a material, that can comprise a protective material, such as epoxy, positioned over at least a portion thereof to protect the electrical interconnect from degradation. In some embodiments, the protective material is distributed in a generally flowable state around at least a portion of the electrical interconnect and/or proximate portions of the first and second conductors.

The protective material can then be rendered into a generally non-flowable state that can provide fluid protection to the electrical interconnect and/or protect the electrical interconnect from degradation. Fluid protection in this context can comprise reducing damage caused by any fluid or fluids in the liquid and/or gaseous state and/or damage caused by any material carried with the fluid. In some embodiments, fluid protection can prevent fluid from entering zones where the fluid may cause degradation of various components contained therein. In some embodiments, the protective material provides such protection, at least in part, by bonding with, or otherwise adhering to, portions of the conductors and support structures.

In some of these embodiments, the protective material can be applied to one or both of the conductors before the interconnect is formed. In further embodiments, the protective material can also act as a flux to aid in formation of the electrical interconnect.

Electrical interconnects commonly occur as "electrical interconnect assembly(s)" where one or more conductors are supported by a first support structure and are electrically interconnected to one or more conductors supported by a second support structure. The electrical interconnect can be especially susceptible to degradation and can be protected by the protective material. Protective material can provide protection from degradation, electrical insulation, and/or mechanical stabilization to the electrical interconnect and/or electrical interconnect assembly.

The embodiments described herein are employed in the context of electrical interconnect assemblies that comprise a portion of an ink jet print cartridge or "print cartridge". It is to be appreciated and understood that various embodiments are equally applicable in other, non-ink jet contexts as well.

Exemplary Printing Device

Figure 1:
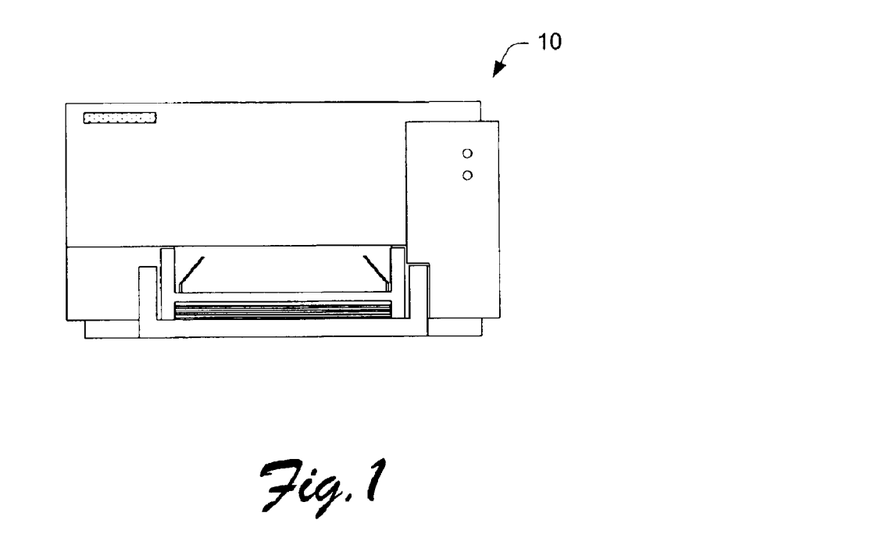
FIG. 1 shows a front elevational view of an exemplary printing device in accordance with one embodiment.

FIG. 1 shows a printing device embodied in the form of an ink jet printer 10. The ink jet printer 10 can be, but need not be, representative of an inkjet printer series manufactured by the Hewlett-Packard Company. The ink jet printer 10 is typically capable of printing in black-and-white and in color. The term "printing device" refers to any type of printer or printing device which ejects ink or other materials onto a print media to achieve at least a portion of its functionality.

Though an inkjet printer is shown for exemplary purposes, it is noted that aspects of the described embodiments can be implemented in other forms of printing devices that employ inkjet printing elements, or other fluid ejecting devices, such as facsimile machines, photocopiers, and the like.

Figure 2:
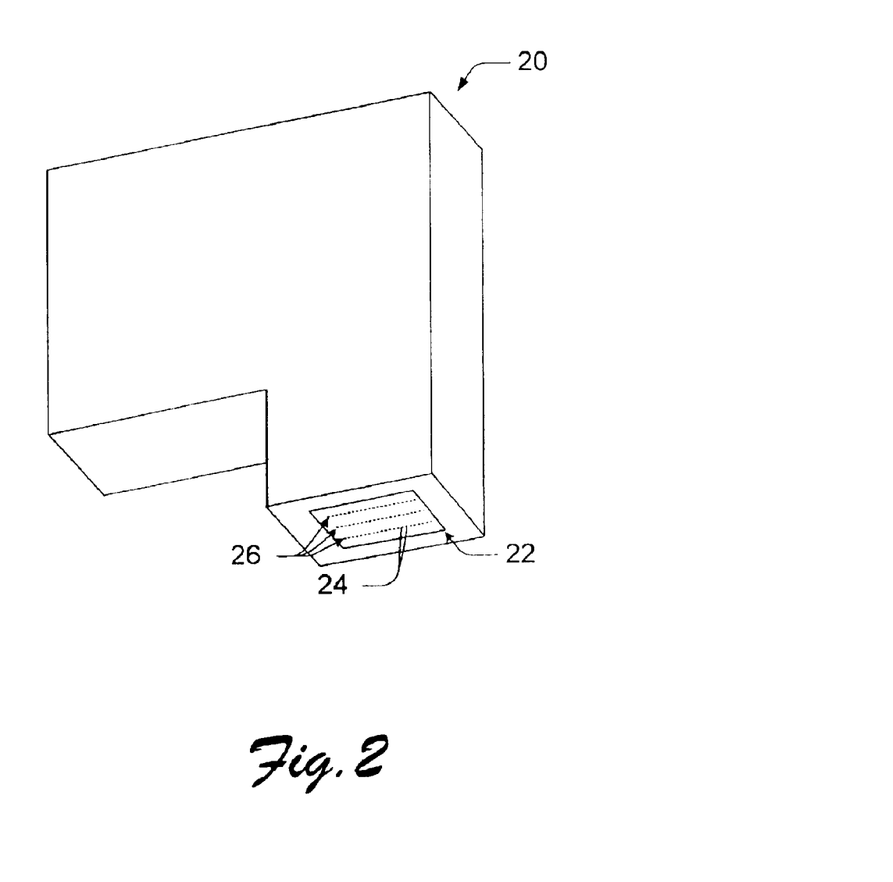
FIGS. 2 and 3 show perspective views of exemplary print cartridges suitable for use in some exemplary printing devices.

FIG. 2 shows a print cartridge 20 that can be installed in printing devices, such as ink jet printer 10. The print cartridge can be electrically coupled with and controlled by a controller, such as a processor, to selectively eject ink to form a desired image on a print media. A print cartridge may be designed to be replaceable during the life of the printing device or may be designed to have a functional lifespan equal to or greater than the printing device.

The print cartridge 20 has one or more print head(s) 22 each of which includes one or more nozzle(s) 24 arranged in one or more generally linear nozzle array(s) 26. A fluid, such as ink, can be selectively ejected from individual nozzles 24 to create a desired image on a print media such as paper, transparencies, etc. In various embodiments, the print cartridge 20 and/or the print media can be moved relative to one another to form portions of the desired image. The print cartridge 20 can contain an internal ink source and/or be connected to an external ink source for supplying ink to the various nozzles 24.

Figure 3:
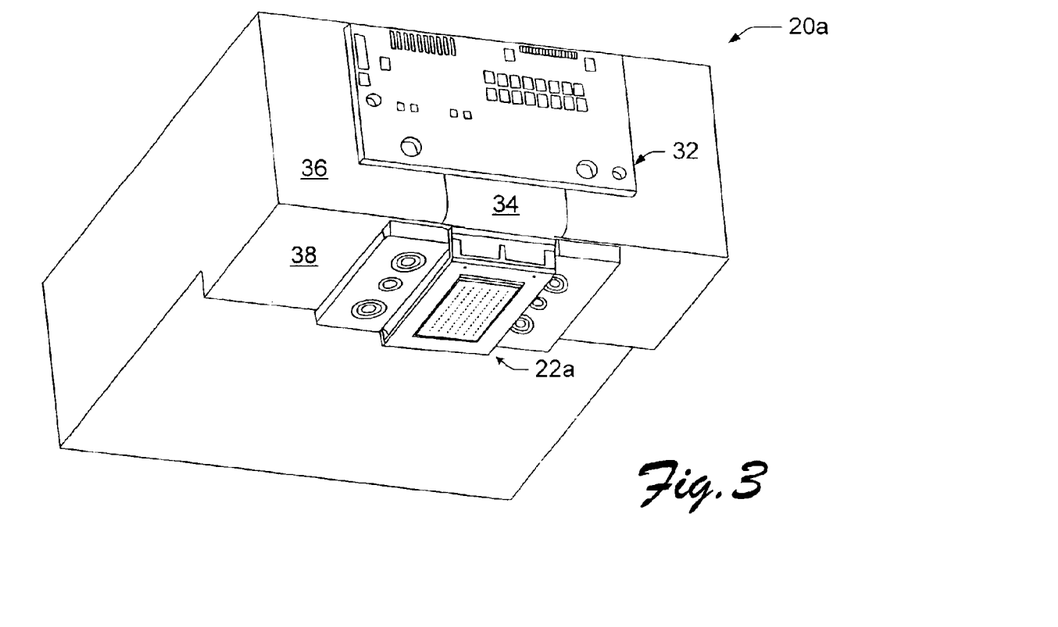

FIG. 3 shows an alternative print cartridge 20a for use in various exemplary printing devices. Print cartridge 20a has a print head 22a electrically coupled to a printed circuit board (PCB) 32 via a flex circuit 34. The PCB 32 is positioned on a first surface 36 of the print cartridge. The print head 22a is positioned on a second surface 38 of the print cartridge, which in this embodiment, is generally orthogonal to the first surface 36.

Figure 4:
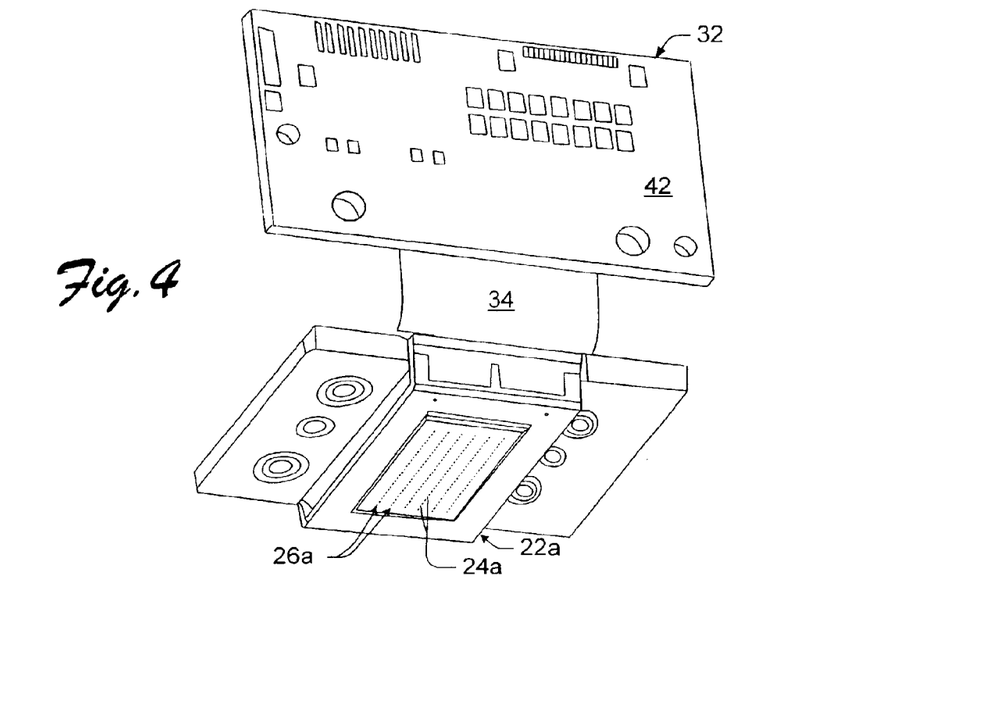
FIG. 4 shows a perspective view of portions of the exemplary print cartridge shown in FIG. 3.

FIG. 4 shows print head 22a, flex circuit 34 and PCB 32 in a little more detail. In this embodiment, the print head 22a comprises six generally linear nozzle arrays 26a. Each array has multiple nozzles 24a. The print head 22a is electrically coupled to the flex circuit 34 which electrically couples the print head to the PCB 32. The PCB has a first surface 42 and a generally opposite second surface 44 (shown in FIG. 5).

Figure 5:
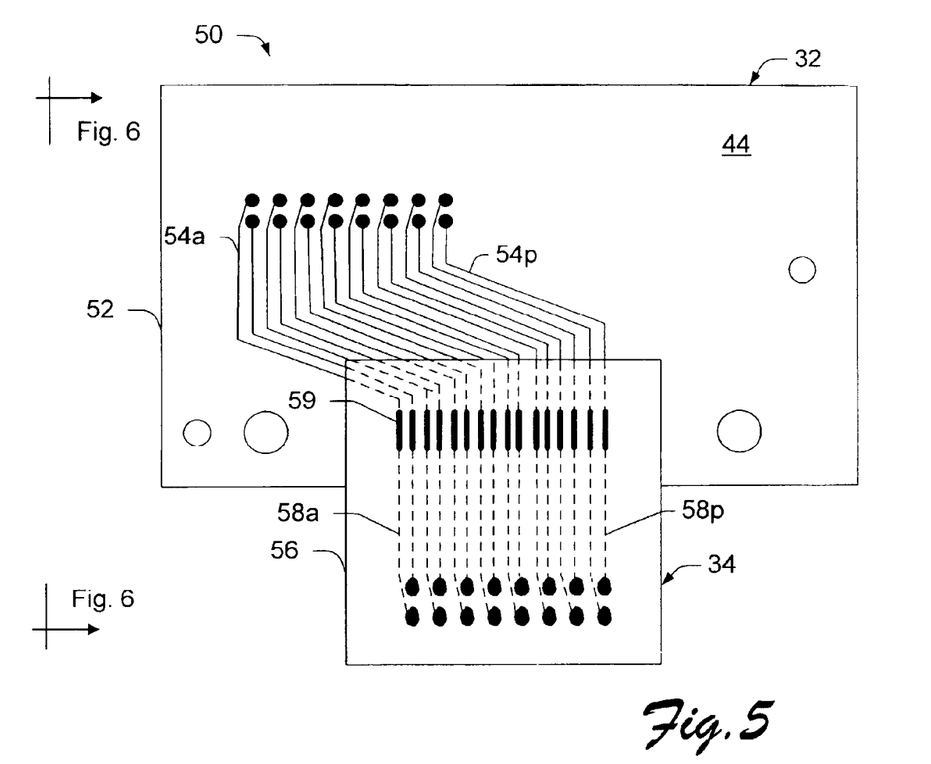
FIG. 5 shows a top plan view of portions of the exemplary print cartridge shown in FIG. 3.

FIG. 5 shows a view of the PCB's second surface 44 and the corresponding view of the flex circuit 34 facing toward the print cartridge's surface's 36, 38 shown in FIG. 3. In this view, portions of some of the described components are obstructed from view, and as such the obstructed portions are indicated with dashed lines for the purposes of clarification. Collectively, the flex circuit 34 and the PCB 32 can provide an example of an electrical interconnect assembly 50. An electrical interconnect assembly can be comprised of a first support structure that supports a first set of one or more conductors and a second support structure that supports a second set of one or more conductors.

In this example, the printed circuit board 32 comprises a first support structure 52 supporting multiple conductors 54a–p. Similarly, the flex circuit 34 comprises a second support structure 56 supporting multiple conductors 58a–p.

Individual conductors supported by the first support structure can be electrically coupled to individual conductors of the second support structure at an electrical interconnect. In this example, an individual conductor, such as 54a is electrically coupled to an individual conductor 58a at electrical interconnect 59a.

A support structure can comprise any suitable material, such as plastic, ceramic or a composite, among others. In this example, the first support structure 52 comprising the PCB 32 is plastic, and the second support structure 56 comprising the flex circuit 34 is a polyimide material, such as Kapton®.

Figure 6:
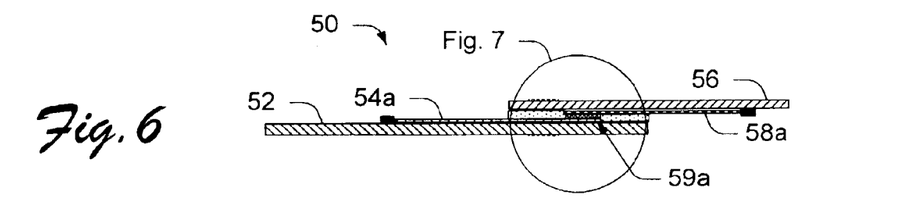
FIG. 6 shows a side view of portions of the exemplary print cartridge shown in FIG. 3.

FIG. 6 shows a side view of the electrical interconnect assembly 50 shown in FIG. 5. An example of an electrical interconnect 59a can be seen electrically connecting first conductor 54a and second conductor 58a.

Figure 7:
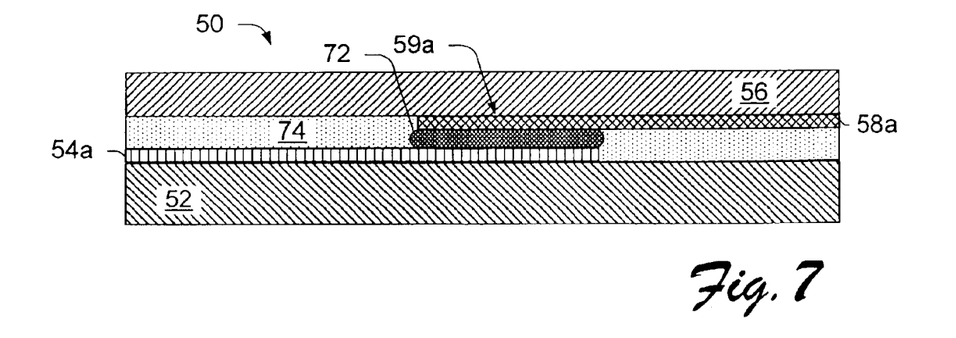
FIG. 7 shows an enlarged view of a portion of the portion of the exemplary print cartridge shown in FIG. 6.

FIG. 7 shows an enlarged portion of the electrical interconnect assembly 50, shown in FIG. 6, in a little more detail. An electrically connective material that in this embodiment comprises solder 72 is contacting portions of first conductor 54a and second conductor 58a to form the electrical interconnect 59a therebetween. Thus, electrical interconnect 59a comprises, at least in part, solder 72 and a portion of each of the first and second conductors 54a, 58a. Other electrically connective material can comprise conductive adhesives and braze materials, among others.

A material, such as protective material 74, essentially surrounds the electrical interconnect 59a in some embodiments. The protective material can provide ink protection and/or otherwise protect the electrical interconnect from degradation. In some embodiments, such protection can be achieved, at least in part, by the protective material bonding with or otherwise adhering to the conductors. One type of protective material comprises epoxy or other similar material. In some of these examples, the epoxy comprises an epoxy flux that, in addition to the protective function, can aid in electrically connecting the conductors to the solder.

In some embodiments, the protective material can comprise multiple compounds. In some of these embodiments, one or more of the multiple compounds can comprise a curing agent. In one such example, in some suitable epoxy fluxes, the flux component also serves as a curing agent.

In some embodiments, epoxy flux can increase the ability of the solder to adhere to or otherwise bond with the conductors. Suitable epoxies are commercially available from various vendors, such as Indium Corp. One suitable epoxy comprises FB-810 from Indium Corp.

Protective material 74 can also bond with, or otherwise adhere to the first and/or second support structures 52, 56 to provide fluid protection. Further, in some of the embodiments where the protective material bonds with, and/or adheres to, one or both of the support structures, other benefits may also be realized. For example, the protective material can provide increased mechanical strength between the first and second support structures.

Figure 8:
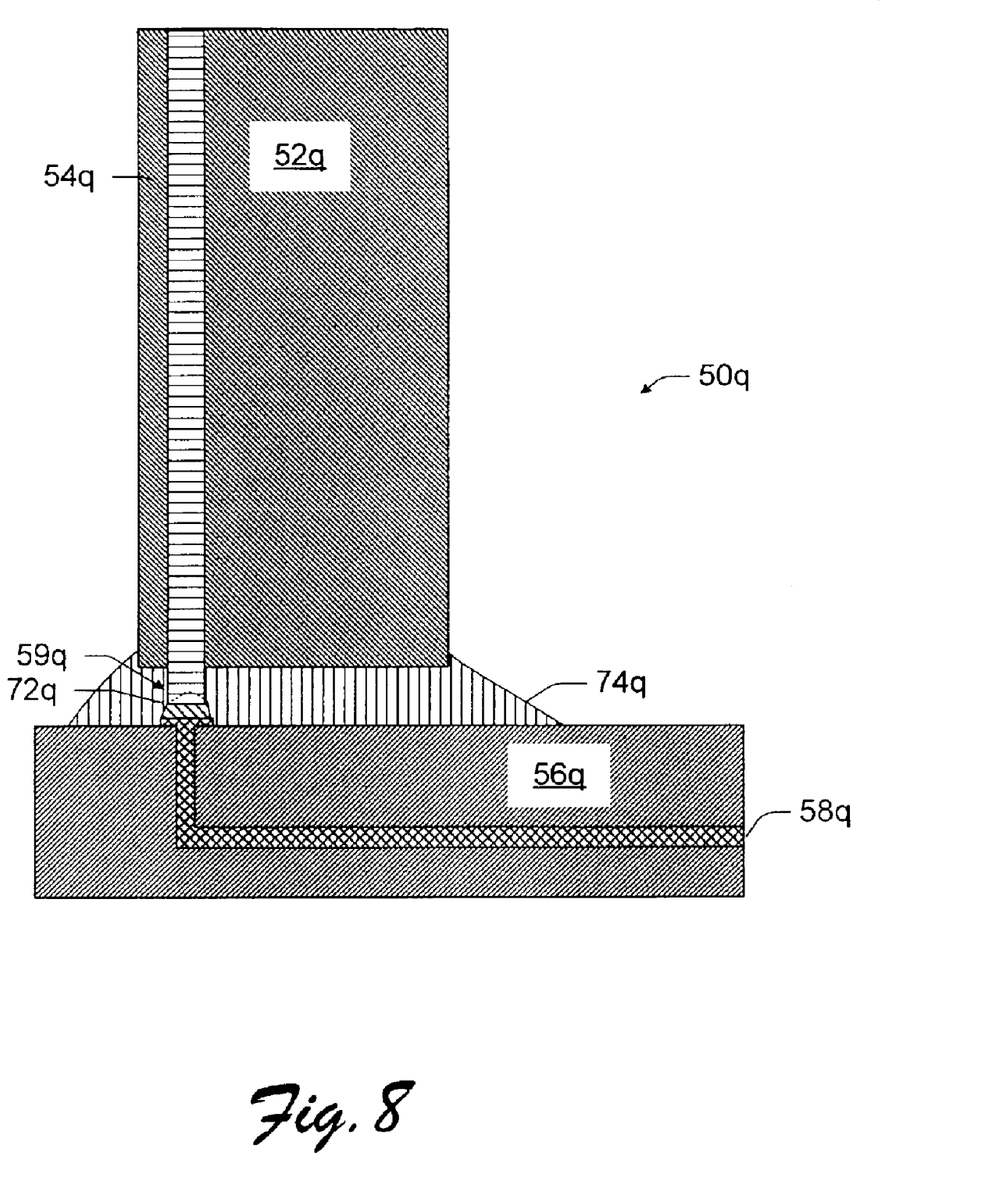
FIG. 8 shows an electrical interconnect assembly in accordance with one embodiment.

FIG. 8 shows a cross-sectional view of another exemplary electrical interconnect assembly 50q that can comprise a portion of a printing device. Electrical interconnect assembly 50q comprises a first support structure 52q supporting a first conductor 54q, and a second support structure supporting 56q supporting a second conductor 58q. Solder 72q facilitates forming an electrical interconnect 59q between conductors 54q and 58q.

Protective material 74q can protect the electrical interconnect 59q from degradation. Examples of such degradation include damage from humidity and/or protection from various fluids such as inks. Some inks are water based and contain compounds which can lead to degradation even when the water has evaporated or otherwise dissipated. In such embodiments, a protective material can be selected which protects the electrical interconnect from degradation from fluids and/or various solid compounds which may otherwise damage the electrical interconnect. The skilled artisan will recognize other suitable embodiments.

FIGS. 9–12 show an exemplary process by which the two support structures and their related conductors can be coupled together to form an electrical interconnect assembly.

Figure 9:
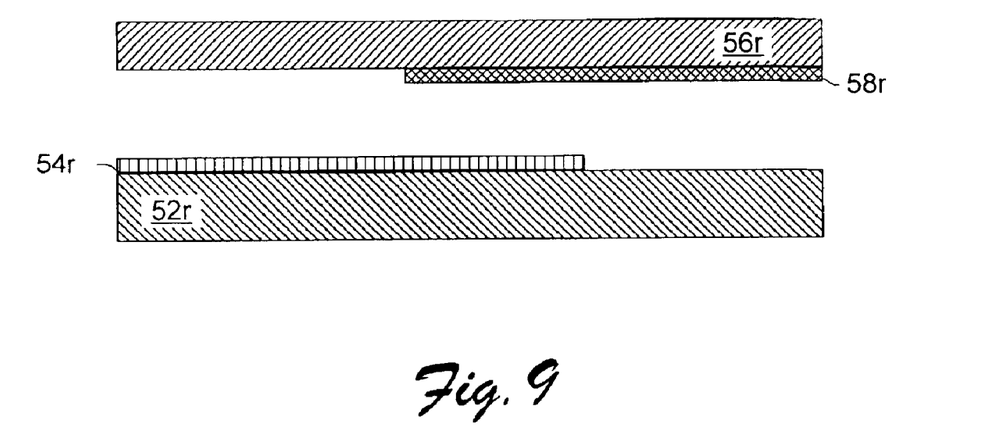
FIG. 9 shows a side view of two exemplary support structures in accordance with one embodiment.
Figure 10:
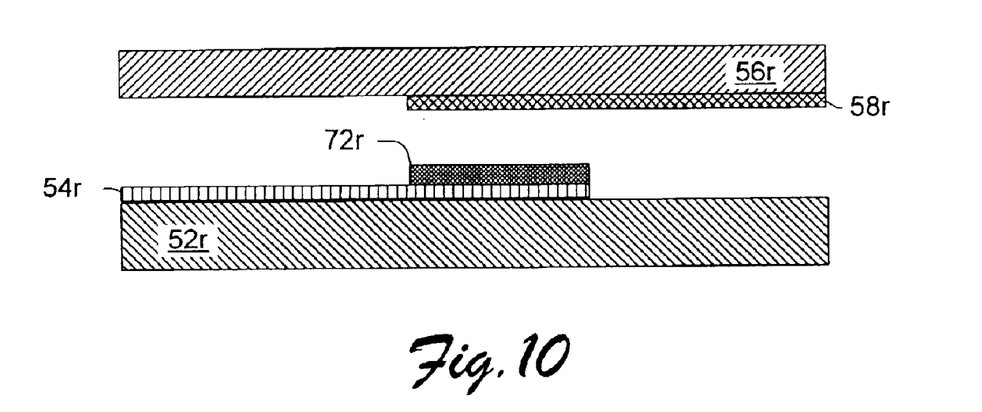
FIG. 10 shows a side view of the two exemplary support structures shown in FIG. 9 with the addition of an additional component in accordance with one embodiment.

Referring to FIG. 9, first support structure 52r supports a first conductor 54r, and second support structure 56r supports second conductor 58r. FIG. 10 shows solder 72r positioned on a portion of conductor 54r. In this embodiment, the portion of the conductor on which solder is positioned can comprise an interface region of the conductor.

In some embodiments, the solder 72r comprises solder paste which can be silk-screened in a desired pattern to precisely position solder paste onto the individual conductor 54r. For example, the solder paste can be stencil printed or hot-air leveled, among others. Though this embodiment shows solder positioned on the first support structure's conductor 54r, other embodiments can alternatively or additionally position solder on the second support structure's conductor.

Figure 11:
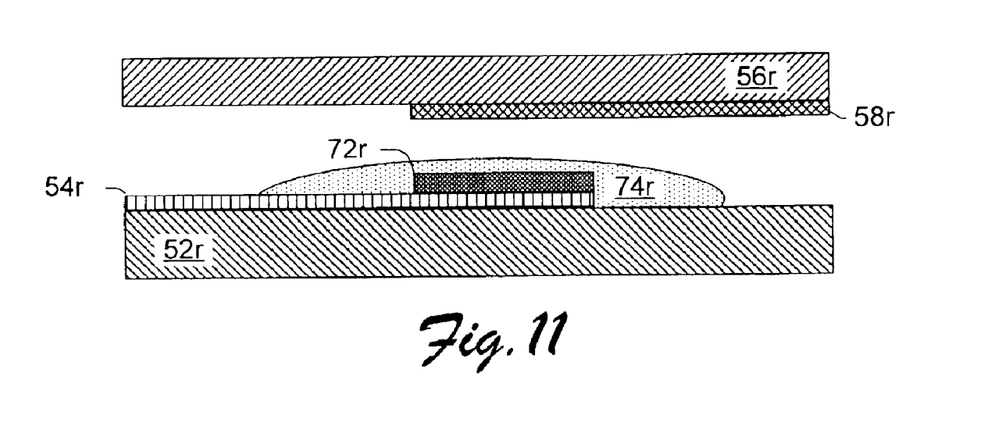
FIG. 11 shows a side view of the two exemplary support structures shown in FIG. 10 with the addition of an additional component in accordance with one embodiment.

In some embodiments, the solder 72r can have a cleaning component, such as a flux, to facilitate formation of an effective electrical interconnect as described in relation to FIG. 11. FIG. 11 shows protective material 74r distributed proximate a portion of the conductor 54r upon which the solder 72r is positioned.

In some embodiments, the protective material can be distributed in a generally flowable state to facilitate distribution. For example, where the protective material comprises epoxy it can be distributed at a temperature which facilitates flowing of the protective material. In one such example, the epoxy can be distributed at approximately room temperature. Other examples, may utilize epoxy application temperatures above or below room temperature.

Various processes can be utilized to distribute the protective material. In one such example, the protective material can be dispensed from a syringe or canula by pressure to the syringe to eject the protective material as desired. This is but one suitable distribution technique. Other suitable distribution techniques will be recognized by the skilled artisan. In this example, the solder and the protective material are positioned on the same conductor 54r. Other implementations can position solder on one conductor and protective material on the other. For example, solder 72r can be positioned on second conductor 58r and protective material 74r positioned on first conductor 54r.

An electrical interconnect 59r can be formed by positioning a portion or interface region of first conductor 54r proximate a portion or interface region of second conductor 58r. In some embodiments, the conductors may physically contact one another. In other embodiments, current may flow between the conductors via the solder 72r.

In some embodiments, interface regions can be connected by, among other factors, reflowing the solder, or otherwise causing it to adhere to and/or bond with the conductors. The solder can subsequently be actively or passively re-solidified. For example, the components may simply be returned to a room temperature environment for a period of time sufficient to allow the solder to re-solidify.

Figure 12:
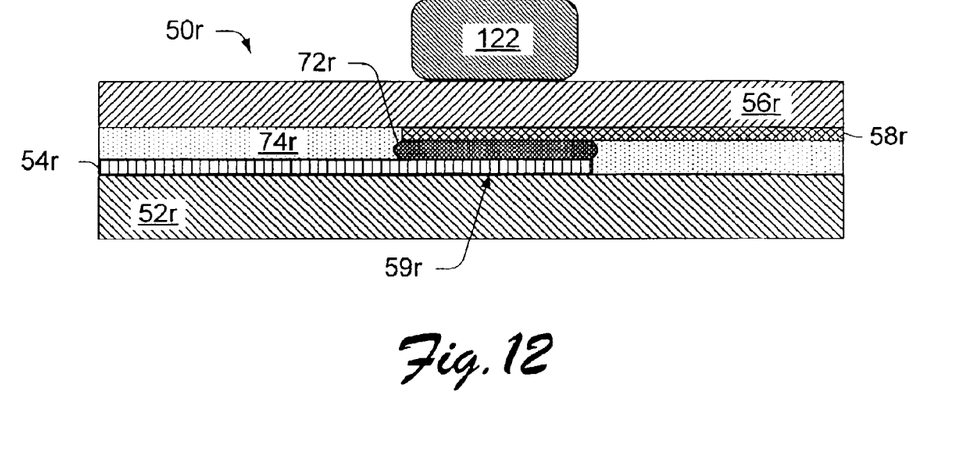
FIG. 12 shows a side view of an exemplary interconnect assembly formed from the support structures and components shown in FIG. 11 in accordance with one embodiment.

FIG. 12 shows one such process, where a hot bar or thermode 122 is utilized to form electrical interconnect 59r. Suitable thermodes can comprise nichrome ceramic, titanium, tungsten, or Boron Nitride, among others. Other suitable processes for forming the electrical interconnect can include laser soldering, hot air level solder, and wave soldering among others.

In some embodiments, thermode 122 is capable of applying pressure and transferring thermal energy to the electrical interconnect assembly. In this implementation, the thermode does not directly contact the conductors, but can instead apply indirect heat and pressure via the second support structure 56r. In some implementations, thermode 122 can reflow the solder 72r which can then be allowed to re-solidify in the presence of the first and second conductors 54r, 58r. Such a process can allow the solder to adhere to or otherwise bond with the conductors to form an electrical interconnect 59r.

Other implementation can melt or otherwise cause a phase change of the solder utilizing other processes. For example, in some embodiments, components of an electrical interconnect assembly can be placed in a heated environment or exposed to other conditions sufficient to melt the solder.

Suitable solder or solder pastes can be chosen based on such factors as the melting temperature of the solder relative to a temperature at which damage may occur to the various components, such as the first and second support structures. Various lead and non-lead solders can be utilized. In some embodiments, solder having a reflow temperature in the 200–300 C. range are utilized. Other embodiments can utilize solders having other melting and/or reflow temperatures. In another example, wave soldering can be utilized to cause the solder to bond to the conductors.

In some implementations, thermode 122 can facilitate the protective material assuming a generally non-flowable state that provides protection to the electrical interconnect. Examples of conditions sufficient to facilitate the protective material becoming generally non-flowing can include heating the protective material, exposing it to UV light, and/or simply allowing it to sit undisturbed for a period of time. In the example shown here, the thermal energy provided by the thermode 122 can facilitate the protective material becoming generally non-flowable.

In embodiments where the protective material comprises epoxy, such a process can entail curing the protective material. With some suitable implementations, curing can cause the epoxy to bond with or adhere to the support structures and conductors, which can lead to increased protection of the electrical interconnect.

Some embodiments can employ thermal matching of the protective material and the solder. In one such example, epoxy can be selected that can be cured by exposing it to a temperature which also reflows the solder, but which does not damage the support structures or other related components. In some such examples, when the components have cooled sufficiently to solidify the solder, an electrical interconnect assembly can be produced which both provides electrical coupling of the conductors and protects the components from degradation.

Exemplary electrical interconnect assemblies and the exemplary methods of forming them can be utilized in many diverse applications. For example, in one such application, the exemplary methods can be utilized on a print head to achieve windowless tab bonding. In such an exemplary application, an electrical interconnect assembly can be formed which comprises a windowless tab bond. Such a windowless tab bond can provide effective protection to the electrical components contained therein. Further, existing tab bonding techniques result in an encapsulation bead which protrudes from the surface of the print head. In contrast, some of the described embodiments can form a tab bond which is generally contiguous with the print head surface. The skilled artisan will recognize many other suitable applications. The skilled artisan will recognize many other suitable applications in the spirit of the examples provided above.

CONCLUSION

The described embodiments provide methods of assembling electrical interconnect assemblies and resultant assemblies. The electrical interconnect assemblies can allow conductors from two different components or support structures to be electrically connected at an electrical interconnect. The electrical interconnect assembly(s) can have a protective material positioned around the electrical interconnect to reduce degradation caused by fluids and/or other materials to the electrical interconnect and associated conductors.

Although the invention has been described in language specific to structural features and methodological steps, it is to be understood that the invention defined in the appended claims is not necessarily limited to the features or steps described. Rather, the features and steps are disclosed as forms of implementing the claimed invention.

What is claimed is:

1. An electrical interconnect assembly comprising:
    a first support structure having one or more conductors positioned thereon;
    a second support structure having one or more conductors positioned thereon;
    an electrical interconnect between an individual conductor of the first support structure and an individual conductor of the second support structure; and, an electrically insulative protective material essentially surrounding the electrical interconnect sufficient to provide ink protection to the electrical interconnect.

2. The electrical interconnect assembly of claim 1, wherein the electrical interconnect assembly comprises a windowless tab bond.

3. The electrical interconnect assembly of claim 1, wherein the protective material comprises a flux component.

4. The electrical interconnect assembly of claim 1, wherein the protective material comprises multiple compounds.

5. The electrical interconnect assembly of claim 4, wherein at least one of the multiple compounds comprises a curing agent.

6. The electrical interconnect assembly of claim 1, wherein the first support structure and the second support structure are comprised of the same material.

7. The electrical interconnect assembly of claim 1, wherein the first support structure and the second support structure are comprised of different materials.

8. The electrical interconnect assembly of claim 1, wherein the first support structure comprises a polymer.

9. The electrical interconnect assembly of claim 1, wherein the second support structure comprises a laminate structure.

10. The electrical interconnect assembly of claim 1, wherein the second support structure comprises a polyimide.

11. The electrical interconnect assembly of claim 1, wherein the first support structure comprises a flex circuit and the second support structure comprises a printed circuit board.

12. An ink jet print cartridge incorporating the electrical interconnect assembly of claim 1.

13. An print cartridge electrical interconnect assembly comprising:
    a first support structure having one or more conductors positioned thereon;
    a second support structure having one or more conductors positioned thereon;
    an electrical interconnect between an individual conductor of the first support structure and an individual conductor of the second support structure; and,
    a protective material surrounding the electrical interconnect sufficient to provide ink protection to the electrical interconnect, wherein the protective material comprises a flux component.

14. The print cartridge electrical interconnect assembly of claim 13, wherein the protective material comprises epoxy.

15. The print cartridge electrical interconnect assembly of claim 13, wherein the protective material comprises epoxy.

16. A print cartridge electrical interconnect assembly comprising:
    an electrical interconnect formed between a conductor of a first support structure and a conductor of a second support structure; and,
    a protective material surrounding the electrical interconnect to provide ink protection to the electrical interconnect, wherein the protective material comprises a flux component configured to facilitate formation of the electrical interconnect.

17. The print cartridge electrical interconnect assembly of claim 16, wherein the electrical interconnect assembly comprises a windowless tab bond.

18. The print cartridge electrical interconnect assembly of claim 16, wherein the protective material comprises multiple compounds.

19. The print cartridge electrical interconnect assembly of claim 18, wherein at least one of the multiple compounds comprises a curing agent.

20. The print cartridge electrical interconnect assembly of claim 16, wherein the first support structure and the second support structure are comprised of the same material.

21. The print cartridge electrical interconnect assembly of claim 16, wherein the first support structure and the second support structure are comprised of different materials.

22. A print cartridge electrical interconnect assembly comprising:
    a set of electrical interconnects formed between individual conductors of a first support structure and individual conductors of a second support structure, wherein individual electrical interconnects comprise solder bonded to an individual conductor of the first support structure and an individual conductor of the second support structure; and,
    an electrically insulative protective material essentially surrounding the set of electrical interconnects sufficient to provide ink protection thereto, the electrically insulative protective material comprising at least one flux component configured to contribute to bonding between the solder and the conductors of an individual electrical interconnect.

23. A print cartridge comprising:
    a first support structure having one or more conductors positioned thereon;
    a second support structure having one or more conductors positioned thereon;
    an electrical interconnect between an individual conductor of the first support structure and an individual conductor of the second support structure; and,
    an electrically insulative protective material essentially surrounding the electrical interconnect sufficiently to provide ink protection to the electrical interconnnect, the material comprising at least one flux component.

24. A windowless tab bond comprising:
    a first support structure having one or more conductors positioned thereon;
    a second support structure having one or more conductors positioned thereon;
    an electrical interconnect between an individual conductor of the first support structure and an individual conductor of the second support structure; and,
    an electrically insulative protective material essentially surrounding the electrical interconnect sufficient to provide fluid protection to the electrical interconnect.

25. The windowless tab bond of claim 24, wherein the electrically insulative protective material comprises a flux component.

26. A print cartridge incorporating the windowless tab bond of claim 24.

* * * * *

UNITED STATES PATENT AND TRADEMARK OFFICE
CERTIFICATE OF CORRECTION

| | |
|---|---|
| PATENT NO. | : 6,905,342 B2 |
| APPLICATION NO. | : 10/404356 |
| DATED | : June 14, 2005 |
| INVENTOR(S) | : Wayne K. Swier et al. |

It is certified that error appears in the above-identified patent and that said Letters Patent is hereby corrected as shown below:

In column 7, line 32, in Claim 13, delete "An" and insert -- A --, therefor.

In column 8, line 40, in Claim 23, delete "interconnnect" and insert -- interconnect --, therefor.

Signed and Sealed this

Fifteenth Day of September, 2009

David J. Kappos
*Director of the United States Patent and Trademark Office*